United States Patent
Lee et al.

(10) Patent No.: US 7,906,252 B2
(45) Date of Patent: Mar. 15, 2011

(54) MULTIPLE RESIST LAYER PHASE SHIFT MASK (PSM) BLANK AND PSM FORMATION METHOD

(75) Inventors: Hsin-Chang Lee, Hsin-Chu (TW);
Chia-Jen Chen, Banciao (TW);
Hong-Chang Hsieh, Hsin-Chu (TW);
Lee-Chih Yeh, Keelung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 748 days.

(21) Appl. No.: 11/369,555

(22) Filed: Mar. 6, 2006

(65) Prior Publication Data
US 2007/0207391 A1 Sep. 6, 2007

(51) Int. Cl.
*G03F 1/00* (2006.01)
*H01L 21/00* (2006.01)

(52) U.S. Cl. ............................................ 430/5; 430/311

(58) Field of Classification Search .............. 430/5, 311, 430/312
See application file for complete search history.

(56) References Cited

U.S. PATENT DOCUMENTS

| | | | |
|---|---|---|---|
| 7,396,617 B2 * | 7/2008 | Rockwell et al. | 430/5 |
| 2001/0006754 A1 * | 7/2001 | Okazaki et al. | 430/5 |
| 2004/0009434 A1 * | 1/2004 | Lin et al. | 430/312 |
| 2004/0043328 A1 * | 3/2004 | Lu | 430/311 |
| 2005/0089763 A1 * | 4/2005 | Tan et al. | 430/5 |
| 2005/0260504 A1 * | 11/2005 | Becker et al. | 430/5 |

* cited by examiner

*Primary Examiner* — Stephen Rosasco
*Assistant Examiner* — Rashid Alam
(74) *Attorney, Agent, or Firm* — Tung & Associates

(57) ABSTRACT

A PSM blank and method for forming a PSM using the PSM blank, the PSM blank including a light transmitting portion; an uppermost anti-reflection portion; a photosensitive layer stack on the anti-reflection portion comprising at least two photosensitive layers; wherein each photosensitive layer has a lower radiant energy exposure sensitivity compared to an underlying layer.

20 Claims, 8 Drawing Sheets

MULTIPLE RESIST LAYER PHASE SHIFT MASK (PSM) BLANK AND PSM FORMATION METHOD

FIELD OF THE INVENTION

This invention generally relates to photomasks for use in circuitry patterning in a micro-integrated circuit manufacturing process and more particularly to a phase shift mask (PSM) blank and method for forming PSM's to reduce PSM manufacturing defects while improving a PSM manufacturing process flow.

BACKGROUND OF THE INVENTION

In semiconductor device manufacturing, photolithography is typically used to transfer a pattern for forming semiconductor features onto a semiconductor process wafer for the formation of integrated circuits. During a photolithographic process, radiant energy such as ultraviolet light is passed through a photomask, also referred to as a reticle, to expose a radiant energy sensitive material such as photoresist formed on the wafer process surface. The mask includes predetermined circuitry patterns having attenuating regions and non-attenuating regions where the radiant energy is modulated in both intensity and phase. In a typical process, exposed portions of the photoresist are developed to form a pattern for subsequent processes such as etching of features into underlying material layers.

As semiconductor device feature sizes have decreased to sizes smaller than the wavelength of light used in photolithographic processes, optical fringing of light passing through a photomask increasingly becomes a problem in forming features with small critical dimensions (CDs), for example less than about 0.25 microns. Light passing through different portions of a photomask causes constructive and destructive interference effects, also referred to as optical fringing or diffraction, which causes undesired light exposure on the photoresist in undesired places. As a result, a loss of pattern resolution in transferring the reticle pattern to the photoresist occurs.

To increase the resolution of a transferred photolithographic pattern, phase shift masks (PSMs) have been developed where the phase of the wavefronts of light passing through the reticle pattern are intentionally phase shifted in selected portions to selectively produce destructive interference thereby reducing undesired light exposures of the photoresist of the photoresist due to diffraction of light passing through the patterned reticle (mask). As a result, the contrast, and therefore, the transferable resolution of the patterned reticle is improved.

There have been several different types of masks developed to improve resolution for different types of mask patterns. For example, in an attenuated or halftone phase shift mask, the phase shifting function is typically accomplished by adding an extra layer of partially transmissive material to the mask with predetermined optical properties. Some PSMs are designed to produce improved resolution while having little improvement in depth of focus, while other PSMs are designed to have relatively modest increases in resolution while producing a greater improvement in depth of focus. For example, attenuated PSMs, also referred to as halftone PSMs, are of the latter type.

In a conventional mask forming process, an opaque layer is typically formed overlying a phase shifting layer. A first photoresist layer is formed and patterned over the opaque layer, followed by etching the pattern into the opaque layer. Following removal of the first photoresist layer, the patterned opaque layer is then used as a hardmask to etch the phase shift layer. A second photoresist layer is then formed over the patterned phase shift and opaque layers, followed by a second patterning and etching process to remove portions of the patterned opaque layer to form a phase shift mask (PSM) including a circuitry pattern.

Problems with prior art PSM formation processes include the necessity of mask alignment and exposure of the PSM in more than one photolithographic patterning process, thereby increasing the probability of optical misalignment and the formation of defects in subsequent etching processes. Moreover, the necessity of more than one photolithographic patterning process to produce the PSM, including associated exposure, development, and removal processes, contributes to a lengthy and therefore costly process flow.

Thus, there is a need in the semiconductor manufacturing art for an improved PSM and method of forming the same to reduce manufacturing defects while improving a process flow.

It is therefore among the objects of the present invention to provide an improved PSM and method of forming the same to reduce manufacturing defects while improving a process flow, in addition to overcoming other shortcomings and deficiencies of the prior art.

SUMMARY OF THE INVENTION

To achieve the foregoing and other objects, and in accordance with the purposes of the present invention, as embodied and broadly described herein, the present invention provides a PSM blank and method for forming a PSM.

In a first embodiment, the PSM blank includes a light transmitting portion; an uppermost anti-reflection portion; a photosensitive layer stack on the anti-reflection portion comprising at least two photosensitive layers; wherein each photosensitive layer has a lower radiant energy exposure sensitivity compared to an underlying layer.

In another embodiment, a method for forming a PSM using a PSM blank includes providing a PSM blank comprising a light transmitting portion and an uppermost anti-reflection portion;
forming a photosensitive layer stack comprising at least two photosensitive layers on the anti-reflective portion each having a lower radiant energy exposure sensitivity compared to an underlying layer; exposing the photosensitive layer stack in a radiant energy exposure process; developing the photosensitive layer stack in a development process to form differently patterned photosensitive layers; and, carrying out a sequential etching processes to form a PSM.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained by reference to the formation of an exemplary phase shift masks (PSM's), it will be appreciated that the method of the present invention in providing and patterning a PSM blank including multiple photoresist layers in a single exposure and development step followed by a multi-step etching process to produce a PSM may be applied to the formation of any type of PSM. For example, opaque, partially transparent and/or transparent PSM blank portions may be advantageously patterned to form differently patterned PSM portions to achieve a desired phase shifting and light interference effect to form an improved PSM while improving a PSM manufacturing process flow.

Figure 1A:
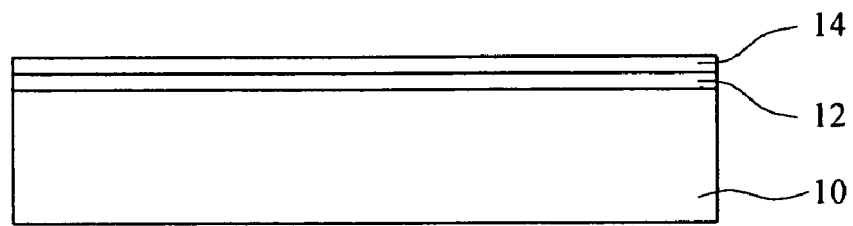
FIGS. 1A through 1H are cross sectional views of a portion of a PSM at stages in manufacture according to an embodiment of the present invention.

Referring to FIG. 1A, is shown an exemplary multiple layer PSM substrate for forming a PSM mask, for example, an attenuating phase shift mask (Att-PSM). A light transparent portion (substrate) 10, typically formed of fused silica or quartz, is provided. It will be appreciated that other light transparent substrates such as calcium fluoride, and glass may be used, however, quartz or fused silica are preferable materials. For example the term light transmitting properties of the PSM substrate is intended to refer to radiant energy having a selected single or range of wavelengths when used together with the PSM in a subsequent photolithographic patterning process to manufacture a semiconductor device.

Still referring to FIG. 1A, a semi-light transparent phase shift portion 12 is then formed over the light transparent substrate 10. It will be appreciated that there are a variety of light phase shifting materials known in the art, including partially light transmissive materials, which may depend on a thickness of the material, including metals, semiconductor, nitrides, oxides, carbides, oxynitrides, oxycarbides, or combinations thereof. For example, the thickness of the phase shifting portion may determine the light transmissive and phase shifting properties of the material. For example, the semi-light transparent phase shift portion 12 is preferably formed to transmit less than about 20% of incident light and produce a phase shift of about 180 degrees with respect to light transmitted through only the light transparent substrate 10. It will be appreciated that the phase shift portion 12 may be formed of one or more materials (layers) including, for example, Cr, Mo, $Mo_xSi_y$ (e.g., MoSi), $MoSi_xN_y$ (e.g., MoSiN), and $MoSi_xO_yN_z$ (e.g., MoSiON).

Still referring to FIG. 1A, an opaque (anti-reflection) portion (e.g., layer) 14, substantially opaque to light transmission and preferably having anti-reflective properties is then formed on the phase shift portion 12. The anti-reflection layer 14 may be formed of a variety of materials and the particular materials used are not intended to limit the present invention. For example, the anti-reflection layer may be formed of one or more materials (layers) including metals, semiconductor, nitrides, oxides, carbides, oxynitrides, oxycarbides, or combinations thereof. Exemplary materials for forming the anti-reflection layer may include one or more layers of Cr, $CrO_xN_y$, and $CrN_x$, and $Cr_2O_3$, SiN, $SiO_xN_y$, SiC $SiO_xC_y$, TiN, $TiSi_xN_y$, and $Mo_xSi_y$.

Figure 1B:
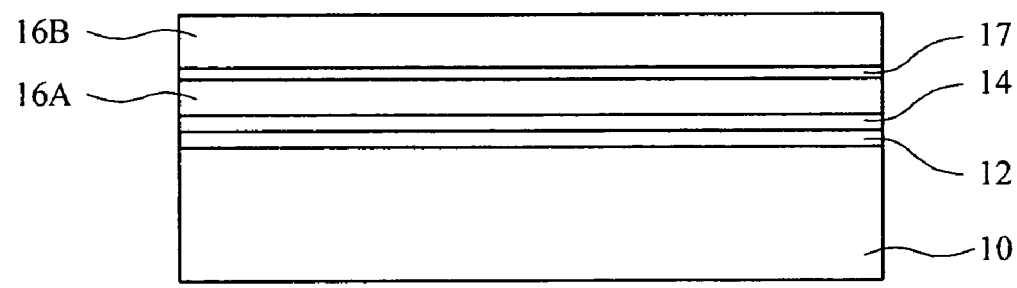

Referring to FIG. 1B, in an important aspect of the invention, multiple photosensitive layers, each photosensitive layer having a different radiant energy sensitivity (photosensitivity), are formed in a photosensitive layer stack on the anti-reflection layer to form a PSM blank. By the term "radiant energy sensitivity" is meant the required amount of radiant energy exposure (light intensity×exposure time) to produce a developable portion. Preferably, each photosensitive layer in the stack has a lower radiant energy sensitivity compared to an underlying photosensitive layer. For example, in one embodiment, a first (lower) photosensitive layer (photoresist) 16A is formed over the anti-reflection layer 14, followed by formation of a second (upper) photosensitive (photoresist) layer) 16B over the first photosensitive layer 16A. Preferably, to prevent reactive interaction of the respective photoresist layers at a photoresist interface, a thin (e.g., 50 to 300 Angstroms) barrier layer 17 of material, preferably a polymer such as a conductive polymer (e.g., metal or semiconductor containing), is formed between the respective photosensitive layers e.g., between photoresist layers 16A and 16B. In a dual photosensitive layer embodiment, the lower photosensitive layer 16A may be formed of either a positive or negative resist and the upper photosensitive layer 16B is preferably formed of a negative photoresist.

Preferably, the lower photosensitive layer 16A has a relatively higher photosensitivity to incident radiant energy (e.g., light exposure) at a selected exposure wavelength compared to the upper photosensitive layer 16B such that a single light exposure process is sufficient to render different portions of the respective photoresist layers developable in a subsequent development process, e.g., to produce different patterns in the respective photoresist layers. Preferably the relative photosensitivity ranges of the photoresist layers do not overlap with respect to one another.

For example, the lower photosensitive (photoresist) layer 16A has a higher photosensitivity to incident radiant energy exposure such that the photoresist layer is developable with respect to exposed (positive resist) or unexposed (negative resist) portions. For example, the lower photoresist layer 16A is developable when exposed to incident radiant energy measured as inducing a charge in the photoresist of less than about 10 micro-coulombs/$cm^2$ and the upper photoresist layer 16B is developable when exposed to incident radiant energy inducing a charge of greater than about 15 micro-coulombs/$cm^2$. It will be appreciated that the incident energy intensity (flux) and exposure amount (fluence) may be measured in numerous ways and the present invention is not intended to be limited by the particular methodology of measuring photosensitivity or the particular photosensitivities. Preferably, a single radiant energy exposure process (i.e., using a single mask) is preferably sufficient to either induce sufficient polymer cross-linking in exposed regions to render the photoresist developable e.g., insoluble (negative photoresist) in a subsequent development process or induce sufficient polymer bond-breaking in exposed regions to render the photoresist developable e.g., soluble (positive photoresist) in exposed regions in a single subsequent development process.

Figure 1C:
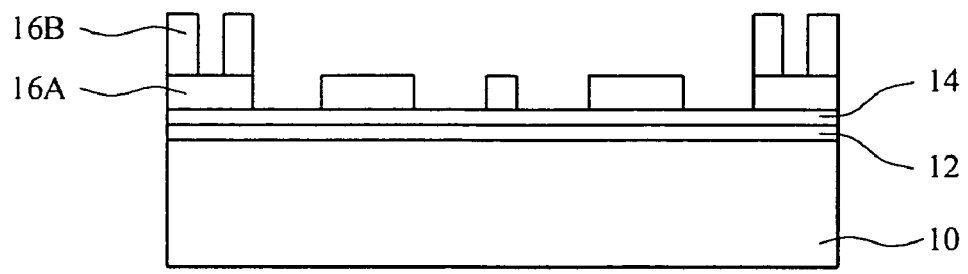

Referring to FIG. 1C, following radiant energy exposure of the photosensitive (e.g., photoresist) layers 16A and 16B, a post exposure bake (PEB) process followed by a wet development process is then carried out to develop both the upper and lower photoresist layers to from differently patterned photoresist layers as exemplified in FIG. 1C. It will be appreciated that since the radiant exposure energy is attenuated by a known amount (i.e., dependent on resist length and absorption coefficient) as it passes through a photoresist thickness, that the photoresist layers 16A and 16B may be formed having predetermined properties (e.g., resist thickness and absorption coefficient) together with a selected radiant energy exposure sensitivity to allow selective exposure of the upper and lower photoresist layers with a desired amount of energy in a single exposure process sufficient to form different patterns in the upper and lower photoresist layers following a development process. It will be appreciated that radiant energy may include conventional UV light sources, laser sources, and electron beam sources.

Figure 1D:
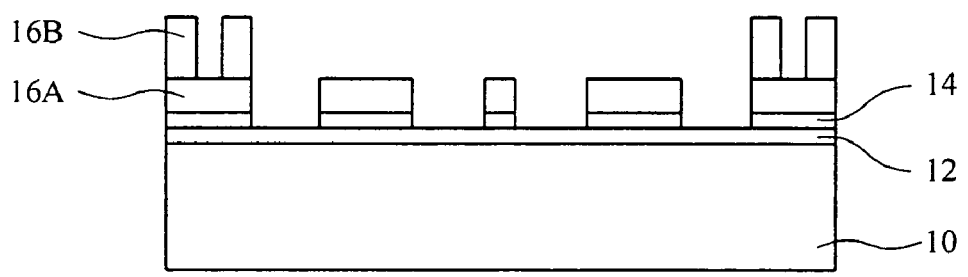

Referring to FIG. 1D, the anti-reflection layer 14, is then etched by a wet and/or dry, preferably a dry etching process, to expose portions of the underlying phase shift mask layer 12 according to the patterned lower photoresist layer 16A.

Figure 1E:
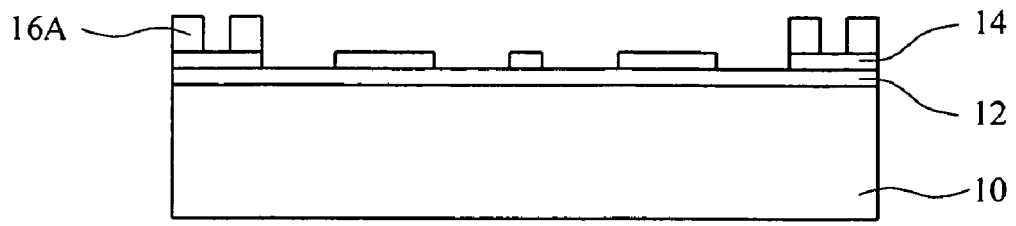

Referring to FIG. 1E, the remaining portions of the lower photoresist layer 16A including residual photoresist is then removed, preferably by a plasma ashing (descum) process. In the descum process all or portions of the upper photoresist layer 16B are removed and new portions of the anti-reflection layer 14 may be exposed.

Figure 1F:
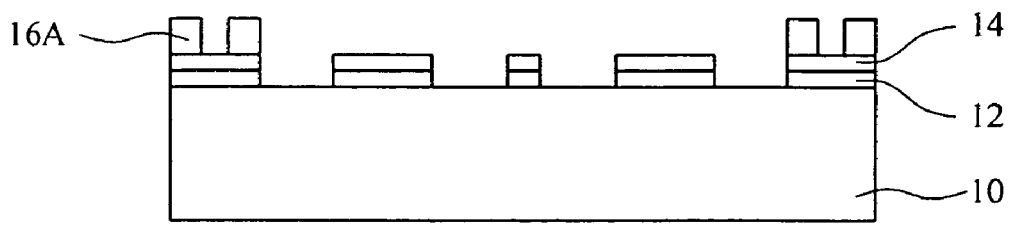

Referring to FIG. 1F, using the patterned anti-reflection layer 14 as a hard mask, a conventional etching (wet and/or dry), preferably a dry etching process, is then carried out to etch through a thickness of the phase shift layer 12 according to the patterned anti-reflection layer 14 to reveal the transparent substrate 10.

Figure 1G:
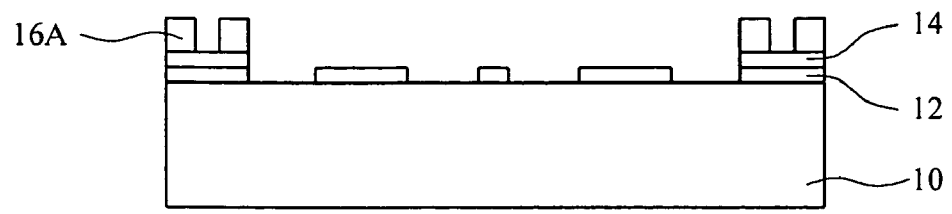

Referring to FIG. 1G, exposed portions of the anti-reflection layer 14 (not covered by the upper photoresist layer 16B), are then removed over the phase shift layer 12 by a wet or dry, preferably a dry etching process.

Figure 1H:
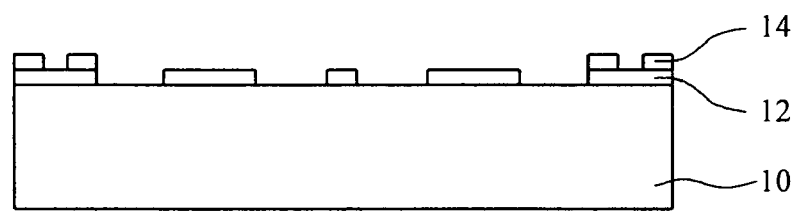

Referring to FIG. 1H, remaining photoresist layer portions (e.g., upper and lower photoresist layer portions, 16A, 16B) are then removed by a wet stripping process followed by a wet cleaning process to produce the PSM, for example an attenuating PSM.

Figure 2:
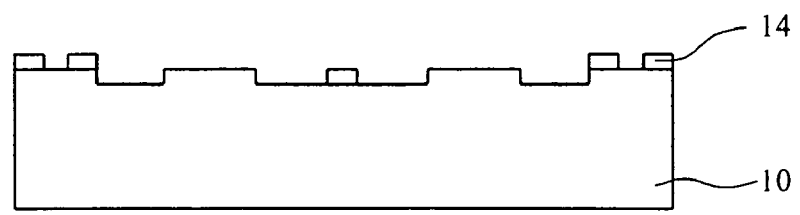
FIG. 2 shows another embodiment of a PSM produced according to the present invention.

Referring to FIG. 2 is shown an alternative embodiment where the light transparent substrate 10 acts as the only light transmitting portion, i.e., no phase shift layer 12 is provided between the anti-reflection layer 14 and the light transparent substrate 10. The same preferred processes as shown in FIGS. 1A through 1H are then carried out, except that the light transparent substrate 10 is etched through a thickness portion rather than the a phase shift layer.

Figure 3A:
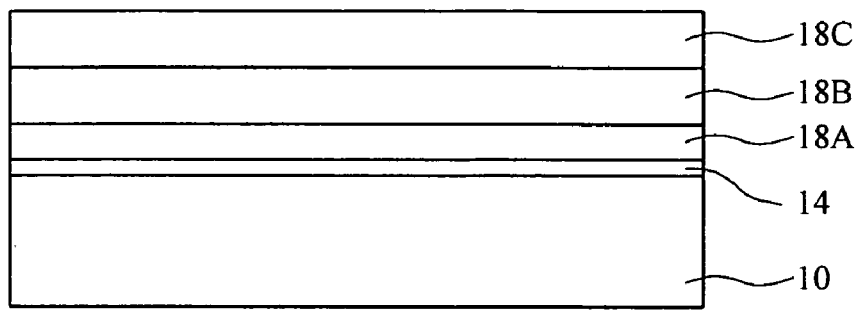
FIGS. 3A through 3G are cross sectional views of a portion of a PSM at stages in manufacture according to an embodiment of the present invention.

Referring to FIG. 3A is shown an embodiment for producing an alternating (Levinson) type PSM. In this embodiment, the light transparent substrate 10 may act as the phase shifting layer, i.e., a phase shift layer 12 is not provided between the anti-reflection layer 14 and the light transparent substrate 10. In addition, three different photosensitive (e.g., photoresist) layers 18A, 18B, and 18C, each having a different photosensitivity to the photolithographic exposure radiant energy are formed in a stack. Preferably, the photoresist layers have respective photosensitivities, similar to the dual layer embodiment, step wise increasing from an uppermost layer 18C, to a lowermost layer 18A, e.g., each photoresist layer having a lower photosensitivity compared to an underlying photoresist layer. Similar to the dual resist layer embodiment, a thin barrier layer e.g., a conductive polymer layer (not shown for clarity) is formed between the respective photoresist layer interfaces e.g., between 18A and 18B and between 18B and 18C to prevent undesired photoresist interactions.

Preferably, all three of the photosensitive layers are formed of either positive or negative, preferably negative photoresist. For example the photoresist layer 18B has a photosensitivity range to the exposure light between that of the uppermost photoresist layer 18C and the lowermost photoresist layer 18A, such that a single light exposure process is sufficient to render different portions of the respective photoresist layers developable (e.g., insoluble) in a subsequent development process to produce different patterns in at least two of the respective photoresist layers e.g., 18A, 18B, and 18C.

Figure 3B:
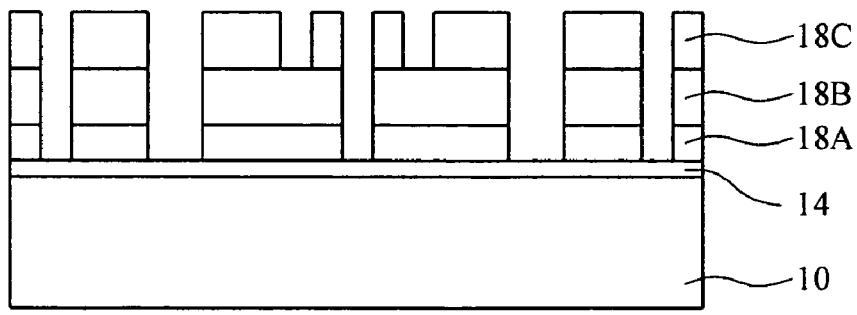

Referring to FIG. 3B is shown an exemplary pattern following a single photolithographic exposure and development process to form differently patterned photoresist layers e.g., 18A and 18B differently patterned from 18C. It will be appreciated that all three photoresist layer may be formed with respective different patterns.

Figure 3C:
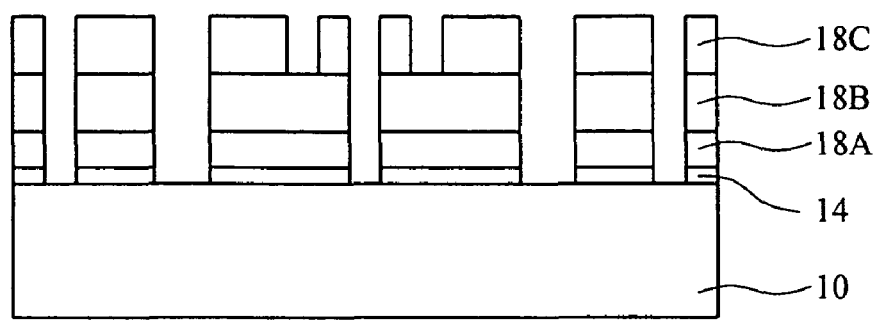

Referring to FIG. 3C, an etching process, preferably a dry etching process, is then carried out to etch through the anti-reflection layer 14 according to the patterned photoresist layers.

Figure 3D:
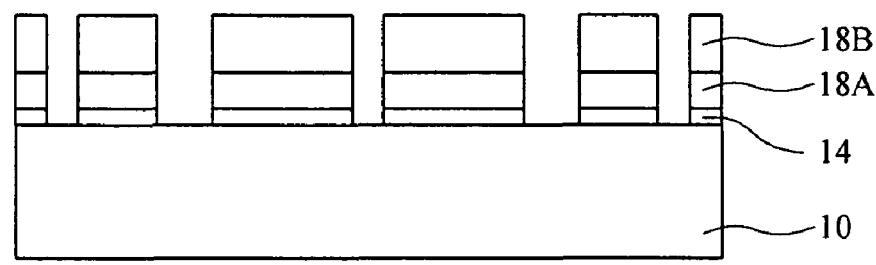

Referring to FIG. 3D, portions of the photoresist layers 18A, 18B, and 18C are then etched by an ashing (descum process) to expose additional portions of the anti-reflection layer 14 as well as remove an upper thickness portion of the photoresist layer stack, e.g., photoresist layer 18C.

Figure 3E:
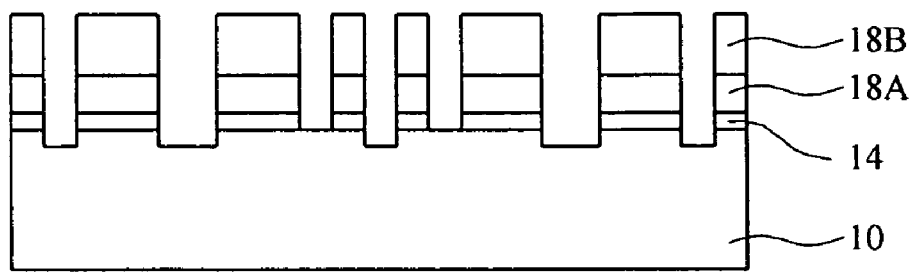

Referring to FIG. 3E, the light transparent portion e.g., quartz substrate 10, is then etched through a thickness portion.

Figure 3F:
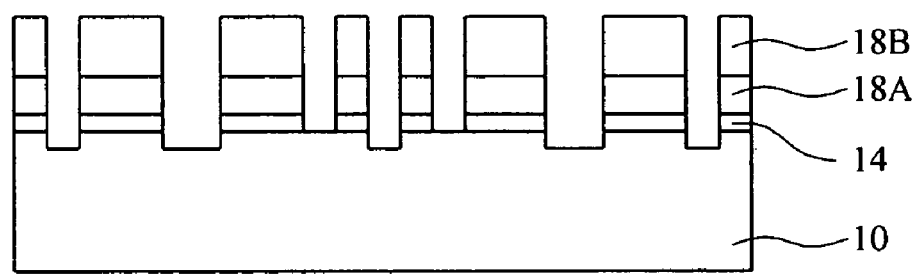

Referring to FIG. 3F, newly exposed portions of the anti-reflection layer 14 formed in the descum process are then etched through a thickness to expose additional portions of the underlying light transparent substrate 10.

Figure 3G:
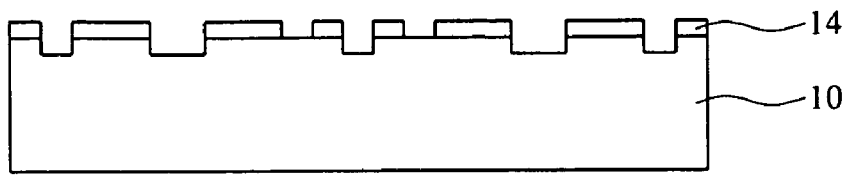

Referring to FIG. 3G, wet stripping and cleaning processes are then carried out to remove remaining photoresist portions (e.g., 18A, 18B) to form an alternating (Levinson) type PSM.

Thus, PSM blanks including multiple overlying photoresist layers having different respective photosensitivities and a method for forming exemplary PSM's has been presented. The different multiple photoresist layers may be advantageously separately patterned in a single radiant energy exposure and development step to decrease patterning alignment defects in PSM's to improve a PSM resolution transfer ability while improving a process flow. Subsequent etching processes are then sequentially carried out to form various types of PSM's including attenuating PSM's and alternating (Levinson) PSM's.

Figure 4:
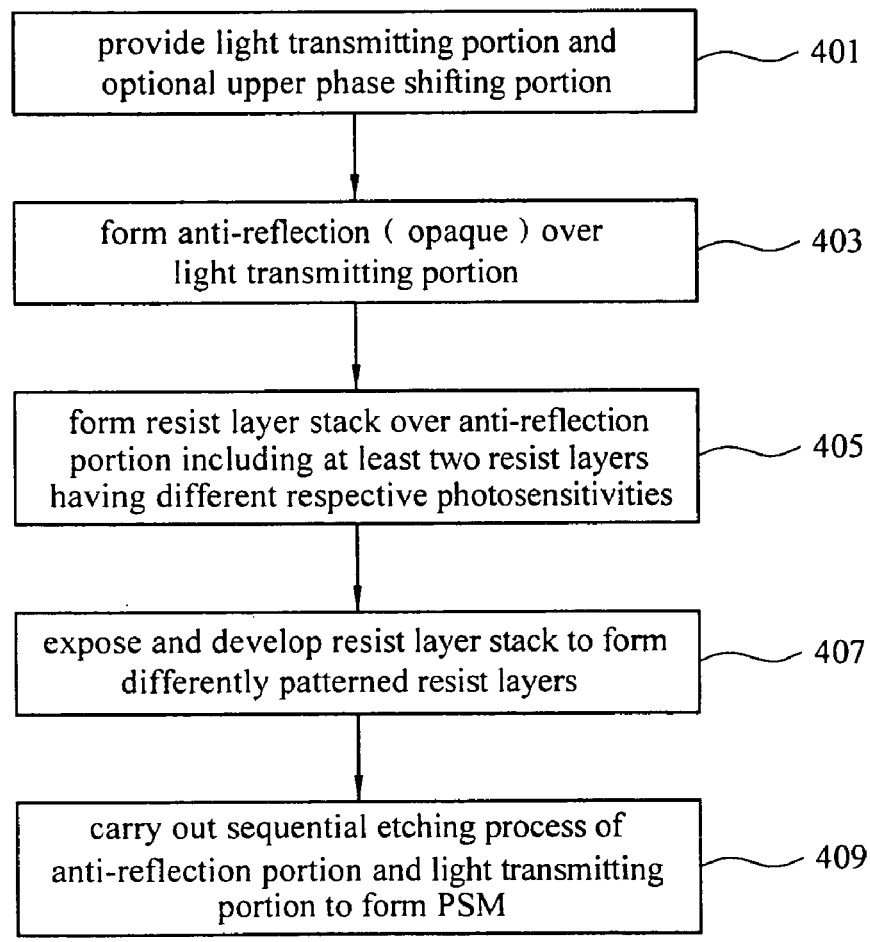
FIG. 4 is a process flow diagram including several embodiments of the present invention.

Referring to FIG. 4 is a process flow diagram including several embodiments of the present invention. In process 401, a light transmitting portion is provided including a light transparent portion and an optional semi-transparent uppermost phase shifting portion. In process 403 an anti-reflection (opaque) portion is formed over the light transmitting portion. In process 405 a resist layer stack having at least two resist layers is formed each resist layer having a lower radiant energy sensitivity (photosensitivities) compared to an underlying resist layer. In process 407, a radiant energy exposure and development process is carried out to form differently patterned resist layers making up the resist stack. In process, 409 a sequential etching process including etching through the anti-reflection layer thickness, etching through a thickness of the light transmitting substrate, and removing portions of the anti-reflection layer are then carried out to form different types of PSM's including attenuating and alternating PSM's.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a phase shift mask (PSM) comprising the steps of:
   providing a PSM blank comprising a light transmitting portion and an uppermost anti-reflection portion;
   forming a photosensitive layer stack comprising at least two photosensitive layers over the anti-reflective portion, each photosensitive layer in the stack having a lower radiant energy exposure sensitivity compared to an underlying photosensitive layer;

exposing the photosensitive layer stack in a single radiant energy exposure process;

developing the photosensitive layer stack in a development process following said radiant energy exposure process to form the at least two photosensitive layers differently patterned; and, carrying out a sequential etching process to form a PSM.

2. The method of claim 1, wherein the sequential etching process comprises:

etching the anti-reflection portion to expose light transmitting portions;

etching the exposed light transmitting portions through a thickness; and, removing portions of remaining materials selected from the group consisting of the photosensitive layer stack and the anti-reflection portion overlying the light transmitting portion.

3. The method of claim 1, wherein the photosensitive layer stack comprises two photoresist layers including at least a first photoresist layer formed over the anti-reflection portion and at least a second photoresist layer formed over the first photoresist layer, and wherein each of the photosensitive layers have relative photosensitivity ranges that do not overlap with respect to one another, wherein the first photoresist layer is developable when exposed to incident radiant energy measured as inducing a charge in the photoresist of less than about 10 micro-coulombs/cm$^2$, and wherein the second photoresist layer is developable when exposed to incident radiant energy inducing a charge of greater than about 15 micro-coulombs/cm$^2$.

4. A method for forming a phase shift mask (PSM) comprising the steps of:

providing a PSM blank comprising a light transmitting portion and an uppermost anti-reflection portion;

forming a photosensitive layer stack comprising at least two photoresist layers over the anti-reflection portion, each photoresist layer comprising a different photoresist type selected from the group consisting of positive and negative photoresist, each photosensitive layer in the stack having a lower radiant energy exposure sensitivity compared to an underlying photosensitive layer;

exposing the photosensitive layer stack in a single radiant energy exposure process;

developing the photosensitive layer stack in a development process following said radiant energy exposure process to form the at least two photosensitive layers differently patterned; and, carrying out a sequential etching process to form a PSM.

5. The method of claim 4, wherein an upper photoresist layer comprises a negative photoresist and a lower photoresist layer comprises a positive photoresist formed over the anti-reflection portion, wherein the upper photoresist layer is formed over the lower photoresist layer, and wherein each of the photosensitive layers do not overlap with respect to one another, wherein the lower photoresist layer is developable when exposed to incident radiant energy measured as inducing a charge in the photoresist of less than about 10 micro-coulombs/cm$^2$, and wherein the upper photoresist layer is developable when exposed to incident radiant energy inducing a charge of greater than about 15 micro-coulombs/cm$^2$.

6. The method of claim 4, wherein each photoresist layer comprises the same photoresist type selected from the group consisting of positive and negative photoresist, formed over the anti-reflection portion, wherein the upper photoresist layer is formed over the lower photoresist layer, and wherein each of the photosensitive layers have relative photosensitivity ranges that do not overlap with respect to one another.

7. A method for forming a phase shift mask (PSM) comprising the steps of:

providing a PSM blank comprising a light transmitting portion and an uppermost anti-reflection portion;

forming a photosensitive layer stack over the anti-reflection portion, said photosensitive layer stack comprising two photoresist layers wherein an upper photoresist layer comprises a positive photoresist and a lower photoresist layer comprises a negative photoresist;

exposing the photosensitive layer stack in a single radiant energy exposure process;

developing the photosensitive layer stack in a development process following said radiant energy exposure process to form the upper and lower photoresist layers differently patterned, wherein the lower photoresist layer is developable when exposed to incident radiant energy measured as inducing a charge in the photoresist of less than about 10 micro-coulombs/cm$^2$, and wherein the upper photoresist layer is developable when exposed to incident radiant energy inducing a charge of greater than about 15 micro-coulombs/cm$^2$; and, carrying out a sequential etching process to form a PSM.

8. The method of claim 7, wherein the sequential etching process comprises:

etching the anti-reflection portion to expose light transmitting portions;

removing a portion of the photoresist comprising residual photoresist following said step of etching the anti-reflection portion;

etching the exposed light transmitting portions through a thickness;

removing exposed portions of the anti-reflection portion overlying the light transmitting portion following etching the exposed light transmitting portions; and removing remaining photoresist portions following removing exposed portions of the anti-reflection portion to form an attenuating PSM.

9. The method of claim 7, wherein the photosensitive layer stack comprises three photoresist layers, and wherein each of the three photoresist layers have relative photosensitivity ranges that do not overlap with respect to one another.

10. The method of claim 9, wherein each photoresist layer comprises the same photoresist type selected from the group consisting of positive and negative photoresist.

11. The method of claim 9, wherein each photoresist layer comprises a negative photoresist.

12. The method of claim 9, wherein the sequential etching process comprises:

etching the anti-reflection portion to expose light transmitting portions;

removing a portion of the photoresist comprising residual photoresist following said step of etching the anti-reflection portion;

etching the exposed light transmitting portions through a thickness; and, etching exposed anti-reflection portions through a thickness to expose underlying light transmitting portion following said step of etching the exposed light transmitting portions; and, removing remaining photoresist portions to form an alternating PSM.

13. The method of claim 1, wherein the light transmitting portion comprises a lowermost substantially light transparent portion and an uppermost semi-light transparent portion for shifting a phase of transmitted light by about 180 degrees.

14. The method of claim 13, wherein the semi-light transparent portion comprises at least one layer comprising a material selected from the group consisting of metal, semiconductor, nitride, oxide, carbide, oxynitride, and oxycarbide.

15. The method of claim 13, wherein the semi-light transparent portion comprises at least one layer comprising a material selected from the group consisting of Cr, Mo, Si, $Mo_xSi_y$, $MoSi_xN_y$, and $MoSi_xO_yN_z$.

16. The method of claim 1, wherein the anti-reflection portion comprises at least one layer comprising a material selected from the group consisting of metals, semiconductor, nitrides, oxides, carbides, oxynitrides, and oxycarbides.

17. The method of claim 1, wherein the anti-reflection portion comprises at least one layer comprising a material selected from the group consisting of Cr, $CrO_xN_y$, $CrN_x$, $Cr_2O_3$, SiN, $SiO_xN_y$, SiC, $SiO_xC_y$, TiN, $TiSi_xN_y$, and $Mo_xSi_y$.

18. The method of claim 1, wherein the light transmitting portion comprises a substantially transparent portion comprising a material selected from the group consisting of fused silica, quartz, calcium fluoride, and glass.

19. The method of claim 1, wherein the photosensitive layer stack further comprises a barrier layer interposed between respective photosensitive layers.

20. The method of claim 19, wherein the barrier layer comprises a material selected from the group consisting of a polymer layer, a semiconductor containing polymer layer, and a metal containing polymer layer.

* * * * *